United States Patent [19]

Bruel et al.

[11] 4,368,083

[45] Jan. 11, 1983

[54] PROCESS FOR DOPING SEMICONDUCTORS

[75] Inventors: Michel Bruel, Veurey-Voroize; Michel Floccari, Grenoble, both of France

[73] Assignee: Commissariat a l'Energie Atomique, Paris, France

[21] Appl. No.: 227,966

[22] Filed: Jan. 23, 1981

[30] Foreign Application Priority Data

Feb. 1, 1980 [FR] France ................ 80 02238

[51] Int. Cl.³ .............. H01L 21/265; H01L 21/324; H01L 21/263
[52] U.S. Cl. .................. 148/1.5; 148/187; 357/91
[58] Field of Search ............ 148/1.5, 187; 357/91

[56] References Cited

U.S. PATENT DOCUMENTS

| | | | |
|---|---|---|---|
| 3,562,022 | 2/1971 | Shifrin ................ | 148/1.5 |
| 3,925,106 | 12/1975 | Ku et al. ................ | 148/1.5 |
| 4,133,701 | 1/1979 | Greenstein et al. ........ | 148/1.5 |
| 4,181,538 | 1/1980 | Narayan et al. .......... | 148/1.5 |
| 4,187,126 | 2/1980 | Radd et al. .............. | 148/1.5 |
| 4,229,232 | 10/1980 | Kirkpatrick ............ | 148/1.5 |
| 4,292,093 | 9/1981 | Ownby et al. .......... | 148/1.5 |

FOREIGN PATENT DOCUMENTS 1336846 11/1973 United Kingdom .
1402998 8/1975 United Kingdom .

OTHER PUBLICATIONS

Chu et al., IBM-TDB, 21 (Jan. 1979) 3154.
Morikawa et al., Japan J. Appl. Phys. 16 (1977) 1281.
White et al., Appl. Phys. Letts. 33 (1978) 662.
Hirao et al., J. Appl. Phys. 50 (Jan. 1979) 193
Ishiwara et al., in Ion Implantation in Solids, 1976, Ed. Chernow et al., Plenum, N.Y., p. 375.
Gat et al., Appl. Phys. Letts. 32 (1978) 276.
Muller et al., Appl. Phys. Letts. 33 (1978) 287.
IBM Technical Disclosure Bulletin, vol. 20, No. 7, Dec. 1977, by H. J. Geipel, et al., "Ultra-thin layer transistors", pp. 2590-2591.
J. Electrochemical Society, vol. 126, No. 8, 1979, J. Golecki et al. "Transient annealing of GaAs by electron and laser beams".
Japanese Journal Applied Physics Supplement, vol. 16, No. 16-1, 1977.
IBM Technical Disclosure Bulletin, col. 23, No. 1, Jun. 1980.
IBM Technical Disclosure Bulletin, vol. 22, No. 9, Feb. 1980.
Nuclear Instruments and Methods, vol 182/3, Apr.-/May 1981.

*Primary Examiner*—Upendra Roy
*Attorney, Agent, or Firm*—Oblon, Fisher, Spivak, McClelland & Maier

[57] ABSTRACT

The present invention relates to a process for doping semiconductors, comprising the successive steps of: effecting implantation by recoil consisting in depositing on the surface of the substrate a layer of material containing dopant particles and in bombarding said layer by means of a beam of bombarding particles, which are in particular non-dopant, so as to cause the dopant particles to penetrate in the substrate; eliminating the layer of material deposited on the surface of the substrate; and effecting transitory annealing. The invention is applicable to the manufacture of solar cells.

11 Claims, 3 Drawing Figures

PROCESS FOR DOPING SEMICONDUCTORS

BACKGROUND OF THE INVENTION

The present invention relates to a process for doping semiconductors.

It is known that doping of a semiconductor consists in implanting foreign particles, or impurities in a substrate constituted by the semiconductor to be doped, and in rendering these impurities electrically active. The addition of impurities in a semiconductor enables the physical properties of said semiconductor, and particularly its electrical properties, to be modified.

Several processes for doping semiconductors are known, such as for example ion implantation, diffusion, epitaxial growth, alloying technique, etc. These different types of doping processes present certain drawbacks and, in particular, that of not being usable universally.

In fact, such or such process is used depending on the dopant particles used and/or the material constituting the semiconductor to be doped. Moreover, these different processes are more or less complex to carry out.

SUMMARY OF THE INVENTION

It is therefore an object of the present invention to provide a process for doping semiconductors which overcomes these drawbacks and which, in particular, is carried out simply and universally.

This process for doping semiconductors, according to the invention, comprises the following successive steps of:

effecting an implantation by recoil of the dopant particles in the substrate, which consists in depositing on the surface of the substrate a layer of material containing dopant particles, and in bombarding said layer by means of a beam of bombarding particles, so as to cause the dopant particles to penetrate in the substrate;

eliminating the layer of material deposited on the surface of the substrate;

effecting transitory annealing, which consists in bringing to the surface, or to the level of the first implanted layers, for a very short length of time, an energy density such that very high temperatures are reached, so as to produce a local liquefaction of the first layers of the substrate.

According to another feature of the invention, the various steps of the process are carried out in the same enclosure in vacuo.

According to a preferred embodiment of the invention, the beam of bombarding particles is constituted by a beam of rare gas ions.

The advantages mentioned previously are indeed offered by the present invention.

In fact, it is known to deposit on the surface of any body constituting the substrate a thin layer of any body or compound constituting the material containing the dopant particles. Similarly, it is simple to produce and use a beam of rare gas ions.

Moreover, the fact of using a very intense ion beam allows a very fast implantation by recoil, and the fact of using a transitory annealing, which is a rapid step of the process, enables the doping of semiconductors of all types to be obtained at a very high rate.

BRIEF DESCRIPTION OF THE DRAWINGS

The invention will be more readily understood on reading the following description with reference to the accompanying drawings, in which.

DETAILED DESCRIPTION OF THE PREFERRED EMBODIMENT

Figure 1:
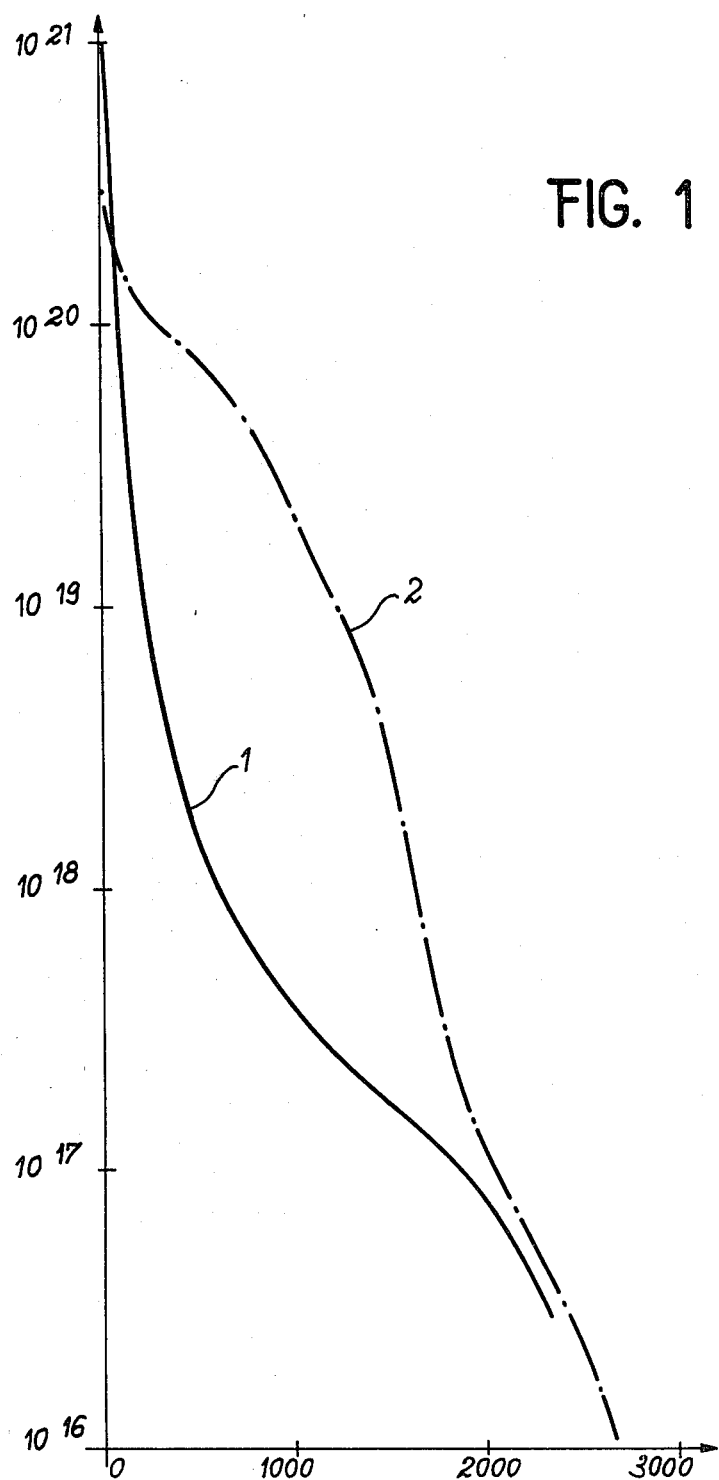
FIG. 1 shows two curves indicating the profile of an implantation by recoil (number of atoms implanted in the substrate per cubic centimeter, expressed in power of ten, as a function of the depth of implantation in the substrate, expressed in Ångströöms), curve 1 representing the profile of the implantation before transitory annealing, curve 2 the profile of the implantation after transitory annealing.

The process of doping semiconductors, according to the invention, consists in the following different steps which will now be described.

The first step is an implantation by recoil which consists in implanting the dopant particles (atoms or ions) in a substrate constituted by the semiconductor to be doped. The dopant particles are contained in a layer of material deposited on the surface of the substrate, preferably by evaporation. The energy necessary for the particles to penetrate in the substrate, included between a few electron-volts and several kilo-electron-volts, comes from a transfer of energy between a beam of bombarding particles, which in particular are non-dopant, which bombards the layer deposits on the substrate, and the dopant particles contained in said layer.

By using a very intense beam of ions of rare gas, preferably argon, implantation by recoil constitutes a fast step of the process.

The second step of the process consists in eliminating, after implantation, the layer of material deposited on the surface of the substrate. The elimination of this layer may be effected either by sublimation in vacuo, by chemical attack, or by ionic atomization. Ionic atomization may be carried out with the aid of an ion beam which may have the same constitution as the ion beam used for implantation by recoil. This ion beam is preferably a beam of argon ions. Of course, the energies conveyed by these beams may be different. In fact, implantation by recoil requires greater energies than ionic atomization.

The third step consists in effecting a transitory annealing, allowing the positioning of the dopant particles in the substitutional sites of the crystal lattice of the substrate, and the rearrangement of this lattice which was disturbed during penetration of the dopant particles in the substrate. This transitory annealing which consists in bringing to the surface or to the level of the first implanted layers, for a very short length of time, an energy density such that very high temperatures are reached so as to produce a local liquefaction of the first layers of the substrate, may be carried out with the aid of a pulsed electron beam or a laser shot.

The different steps of the process, whatever their embodiment, may be carried out in the same enclosure in vacuo.

As the techniques used for depositing the layer of dopant material then for eliminating same are known, a more detailed description thereof will not be given.

This process of doping according to the invention was carried out with a layer of material containing dopant particles, of antimony, and a substrate of silicon. Implantation by recoil was carried out by means of a beam of argon particles carrying an energy of 100 keV. The deposit of the layer of dopant material was carried out as described hereinabove, as well as elimination thereof. By effecting elimination by ionic atomization with the aid of a beam of argon particles, it suffices to use a beam carrying an energy of 500 eV to 1 keV, i.e. about 100 to 200 times less energetic than for implantation by recoil. For transitory annealing by laser shot, a ruby laser carrying 0.3 Joule of energy in pulse form for 15 nanoseconds, was used. Transitory annealing by electron pulse was effected with the aid of machines of type SPI 300 and SPI 5000 marketed by SPIRE (U.S.A) enabling an energy density of the order of 1 J/cm$^2$ to be supplied.

Detailed studies of this doping process have shown that the association of implantation by recoil with transitory annealing leads to fast and effective doping of semiconductors.

In fact, with reference to FIG. 1, and in particular to curve 1 representing the profile of an implantation by recoil, before transitory annealing, it is observed that the surface concentration of the dopant particles is very high, generally 100 times higher than than the concentration obtained by a conventional method of implantation. Curve 2 represents what curve 1 becomes, i.e. implantation by recoil after transitory annealing. The profiles of the implantation by recoil have been plotted on one of the isotopes of antimony implanted in silicon. Transitory annealing was carried out with the aid of a pulsed electron beam.

The fact of using transitory annealing enables the particles of antimony to penetrate in the silicon in depth. Moreover, the fact of using such annealing does not cause the antimony particles, which were introduced by implantation by recoil, to re-emerge. In fact, by integration of the concentration profile and by direct measurement due to analysis by neutron activation, it has been verified on the profiles plotted (curves 1 and 2) that, to within 15%, the number of antimony particles per cubic centimeter introduced into the substrate is the same as the number of dopant particles present in the silicon substrate, after transsitory annealing. On the other hand, if conventional annealing is used, i.e. the fact of taking the implanted substrate to high temperature for a more or less long period of time, it is observed that 80 to 90% of the implanted particles re-emerge from the substrate, this being connected with the high concentration of the dopant particles implanted, present on the surface. Moreover, the electrical qualities of such a semiconductor (implantation by recoil, followed by conventional annealing) are considerably inferior to those obtained for the same annealing, with conventional implantation. On the other hand, the electrical qualities obtained for a doped semiconductor according to the invention (implantation by recoil followed by transitory annealing) are the same as those obtained with conventional doping (conventional ion implantation and conventional annealing); in particular, the resistivities are equal, to within the precision of the measurement (about 50 Ohms per square for 5·10$^{14}$ ions of antimony, implanted by recoil per cm$^2$).

Other studies have shown that the presence of a rare gas in the substrate, due to the implantation by recoil with a beam of rare gas ions, and particularly argon, does not explain the anomalies obtained when employing conventional annealing.

Moreover, the doping process according to the invention has the advantage of presenting, under certain conditions, a range of stationary state as far as the effectiveness of recoil is concerned, i.e. the number of dopant particles penetrating in the substrate per bombarding particles. This effectiveness generally depends on the energy brought by the bombarding particles and on the thickness of the layer of material deposited on the substrate, but zones exist where this effectiveness is stationary, i.e. the number of dopant particles penetrating in the substrate depends only on the number of incident bombarding particles. The number of bombarding particles being controllable simply and with precision renders the use of the process easy to master. It should be noted that the effectiveness of the recoil may be greater than one and may reach a value equal to three.

Figure 2:
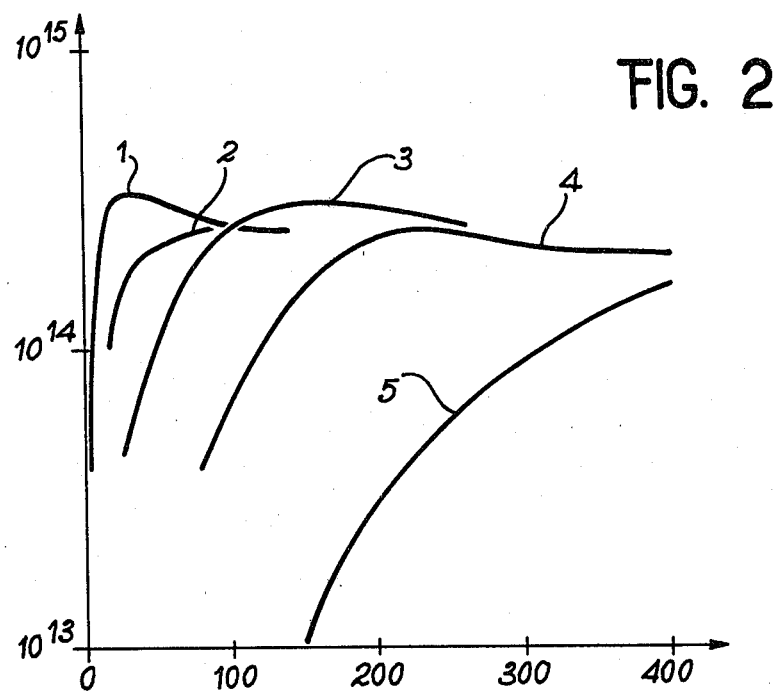
FIG. 2 shows five curves indicating the effectiveness of the recoil (number of particles penetrating in the substrate) as a function of the energy of the bombarding particles (expressed in kilo-electron-volt) for different thicknesses of the layer deposited on the substrate.
Figure 3:
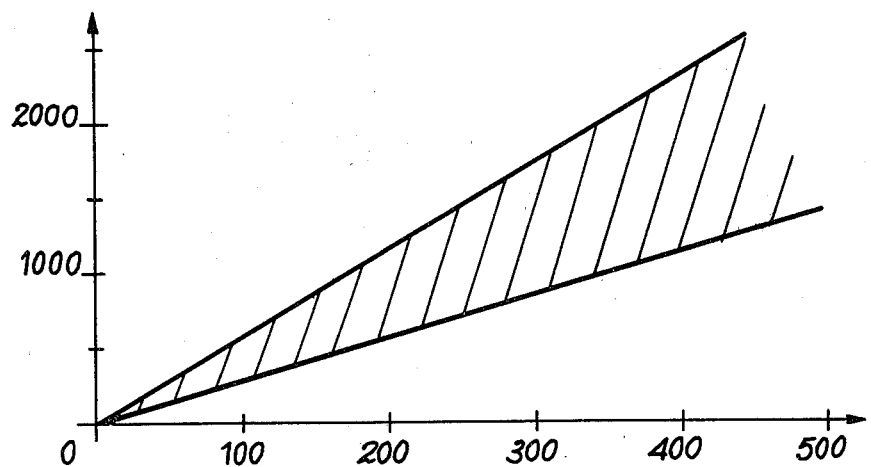
FIG. 3 represents a range of stationary effectiveness of the implantation by recoil of particles of antimony in a substrate of silicon with the aid of a beam of argon particles (thickness of the layer of antimony expressed in Ångtröms as a function of the energy of the incident particles of argon expressed in kilo-electron-volt).

The range of stationary state is illustrated with the aid of the five curves in FIG. 2 and the curve of FIG. 3.

FIG. 2 shows the effectiveness of the recoil as a function of the energy of the bombarding particles. The dopant particles are constituted by antimony, the substrate is made of silicon and the bombarding particles are constituted by argon ions. The argon ion beam used for the five curves is the same and contains $3 \times 10^{14}$ ions/cm$^2$.

Curve 1 corresponds to a layer of antimony deposited on the substrate of 150 Å thickness, curve 2 to a layer of 300 Å, curve 3 to a layer of 620 Å, curve 4 to a layer of 1200 Å, and curve 5 to a layer of 2500 Å. With the aid of these five curves, it is observed that the number of particles implanted by recoil for a given thickness and from a given energy, tends towards a value of $6 \times 10^{14}$/cm$^2$, which corresponds to double the number of incident argon particles. Of course, this value is more or less quickly reached depending on the thickness of the layer deposited and the necessary energy is more or less high. This shows that zones exist (function of the energy of the incident particles and the thickness) where this effectiveness is stationary.

This result is clearly illustrated in FIG. 3. The range where the effectiveness of the recoil is stationary is represented by the hatched zone. This range corresponds to an implantation of particles of antimony in silicon, with the aid of a beam of argon ions. This curve shows that the effectiveness of the recoil varies little when the thickness of the layer deposited on the substrate and/or the energy of the incident particles vary considerably. In this range, the effectiveness of the recoil is of the order of two.

It will be noted that this range of stationary effectiveness is not peculiar to the process using argon and antimony for doping the silicon. The existence and size of this range are connected with the distribution between electron deceleration and nuclear deceleration produced in the deposited layer. The fact that the effectiveness is stationary is promoted by a predominance of nuclear deceleration. This range of stationary effectiveness is different when one of the following three parameters: nature of the layer deposited, nature of the bombarding particle or ion, nature of the substrate, is modified.

This doping process, which is simple and fast to carry out, may be applied to the manufacture of solar cells based on silicon or another semiconductor.

What is claimed is:

1. Process for doping semiconductors consisting in implanting dopant particles in a substrate and in rendering them electrically active, so as to modify the physical properties of the substrate, comprising the following successive steps of:

effecting an implantation by recoil of the dopant particles in the substrate, which consists in depositing on the surface of the substrate a layer of material containing dopant particles, and in bombarding said layer by means of a beam of bombarding particles, so as to cause the dopant particles to penetrate in the substrate;

eliminating the layer of material deposited on the surface of the substrate;

effecting transitory annealing, which consists in bringing to the surface, or to the level of the first implanted layers, for a very short length of time, an energy density such that very high temperatures are reached, so as to produce a local liquefaction of the first layers of the substrate.

2. The doping process of claim 1, wherein the layer of material containing the dopant particles is made by evaporation.

3. The doping process of either one of claims 1 and 2, wherein the beam of bombarding particles is constituted by a beam of rare gas ions.

4. The process of either one of claims 1 to 2, wherein the layer of material deposited on the substrate is eliminated by sublimation.

5. The doping process of either one of claims 1 to 2, wherein the layer of material deposited on the substrate is eliminated by means of chemical attack.

6. The doping process of either one of claims 1 to 2, wherein the layer of material deposited on the substrate is eliminated by ionic atomization with the aid of an ion beam.

7. The doping process of either one of claims 1 to 2, wherein the transitory annealing is effected with the aid of a pulsed electron beam.

8. The doping process of either one of claims 1 to 2, wherein transitory annealing is effected with the aid of a laser shot.

9. The doping process of either one of claim 1 to 2, wherein the different steps of the process are carried out in the same enclosure in vacuo.

10. The doping process of claim 3, wherein the ion beam used for implantation by recoil has the same constitution as that used for eliminating the layer of deposited material.

11. Application of the process of either one of claims 1 to 2 to the doping of silicon by antimony with the aid of a bombardment of argon ions, wherein the respresentative point, having the thickness of the layer of dopant material for x-axis and the energy of the bombarding particles for y-axis, is located within the range between two curves represented by $y_1 = m_1 X$ and $y_2 = m_2 X$ where $y_1 = 1500$, $y_2 = 3000$, $X = 500$, $m_1 = 3$ and $m_2 = 6$ for values of X from 0 to approximately 500 Angstrom.

* * * * *